(12) United States Patent
Lopatin et al.

(10) Patent No.: US 6,893,955 B1
(45) Date of Patent: May 17, 2005

(54) MANUFACTURING SEEDLESS BARRIER LAYERS IN INTEGRATED CIRCUITS

(75) Inventors: Sergey D. Lopatin, Santa Clara, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/328,347

(22) Filed: Dec. 24, 2002

Related U.S. Application Data

(62) Division of application No. 09/760,422, filed on Jan. 11, 2001, now Pat. No. 6,555,909.

(51) Int. Cl.[7] .......................................... H01L 21/4763
(52) U.S. Cl. ...................... 438/627; 438/637; 438/648
(58) Field of Search ................................ 438/627, 637, 438/648, 686, 687

(56) References Cited

U.S. PATENT DOCUMENTS 6,268,291 B1 * 7/2001 Andricacos et al. ........ 438/694
6,482,733 B2 * 11/2002 Raaijmakers et al. ....... 438/633
2003/0198587 A1 * 10/2003 Kaloyeros et al. .......... 423/409

* cited by examiner

*Primary Examiner*—Amir Zarabian
*Assistant Examiner*—Pamela E Perkins
(74) *Attorney, Agent, or Firm*—Mikio Ishimaru

(57) ABSTRACT

An integrated circuit manufacturing method is provided having a semiconductor substrate with a semiconductor device. A device dielectric layer is formed on the semiconductor substrate and a channel dielectric layer on the device dielectric layer has an opening formed therein. A barrier layer lines the channel opening and a conductor core fills the opening over the barrier layer. A seedless barrier layer lines the opening, and a conductor core fills the opening over the seedless barrier layer. The barrier layer is deposited in the opening and contains atomic layers of barrier material which bonds to the dielectric layer, an intermediate material which bonds to the barrier material layer and to the conductor core, and a conductor core material which bonds to the intermediate material. The conductor core bonds to the conductor core material.

10 Claims, 2 Drawing Sheets

MANUFACTURING SEEDLESS BARRIER LAYERS IN INTEGRATED CIRCUITS

CROSS REFERENCE TO RELATED APPLICATIONS

This is a divisional of application Ser. No. 09/760,422, filed on Jan. 11, 2001 now U.S. Pat. No. 6,555,909.

TECHNICAL FIELD

The present invention relates generally to semiconductor technology and more specifically barrier layers in integrated circuits.

BACKGROUND ART

In the manufacture of integrated circuits, after the individual devices such as the transistors have been fabricated in and on the semiconductor substrate, they must be connected together to perform the desired circuit functions. This interconnection process is generally called "metalization" and is performed using a number of different photolithographic, deposition, and removal techniques.

Briefly, individual semiconductor devices are formed in and on a semiconductor substrate and a device dielectric layer is deposited. Various techniques are used to form gate and source/drain contacts, which extend up to the surface of the device dielectric layer. In a process called the "damascene" technique, dielectric layers are deposited over the device dielectric layers and openings are formed in the dielectric layers. Conductor materials are deposited on the dielectric layers and in the openings. A process is used to planarize the conductor materials with the surface of the dielectric layers so as to cause the conductor materials to be "inlaid" in the dielectric layers.

More specifically for a single layer of interconnections, a "single damascene" technique is used in which the first channel formation of the single damascene process starts with the deposition of a thin first channel stop layer over the device dielectric layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide fair barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit. However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

For more complex integrated circuits, a "dual damascene" technique is used in which channels of conductor materials are separated by interlayer dielectric layers in vertically separated planes and interconnected by vertical connections, or "vias".

More specifically, the dual damascene process starts with the deposition of a thin etch stop layer, or the via stop layer, over the first channels and the first channel dielectric layer. A via dielectric layer is deposited on the via stop layer. Again, where the via dielectric layer is of an oxide material, such as silicon oxide, the via stop layer is a nitride, such as silicon nitride, so the two layers can be selectively etched.

Second channel stop and second channel dielectric layers are formed on the via dielectric layer. Again, where the second channel dielectric layer is of an oxide material, such as silicon oxide, the second channel stop layer is a nitride, such as silicon nitride, so the two layers can be selectively etched. The second channel and via stop layers and second channel and via dielectric layers are then subject to further photolithographic process, etching, and photoresist removal steps to form via and second channel openings in the pattern of the second channels and the vias.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The capping layer may be an etch stop layer and may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metalization process. The elimination of metal etch steps is important as the semiconductor industry moves from aluminum (Al) to other metalization materials, such as copper, which are very difficult to etch.

As copper seed layers become thinner and thinner, agglomeration or the formation of low energy islands, or masses, occurs which prevent the uniform spreading out of the seed layer over the barrier layer.

In addition to uneven seed layer thickness, agglomeration causes voids during the deposition of the conductor core. It is the voids in the via which are probably the most problematic since they increase the resistance in the via.

Further, the voids in the via contribute to the formation of larger voids due to increased electromigration of the copper atoms through the void restricted via during operation of the semiconductor device. The voids can grow to the point where open circuits occur which lead to the failure of the integrated circuit.

Even further, since the seed layer and the barrier layer are not fully bonded, interface diffusion, or the electromigration of seed material, along the boundary between the layers becomes problematic. This is especially true with copper seed layers and barrier layers of tantalum or tungsten and their nitrides or carbides.

Still further, as the channels become smaller, the barriers become even greater portions of the cross-sections of the channels which results in a proportional increase in overall barrier resistivity and total interconnect resistivity.

A solution, which would reduce overall barrier resistivity and increase electromigration resistance while improving resistance to interface diffusion, has long been sought, but has equally long eluded those skilled in the art.

DISCLOSURE OF THE INVENTION

The present invention provides a method for manufacturing an integrated circuit having a semiconductor substrate with a semiconductor device. A dielectric layer is formed on the semiconductor substrate and an opening is formed in the dielectric layer. A barrier layer is deposited to line the opening and a conductor core is deposited to fill the channel opening over the barrier layer. The barrier layer is deposited by atomic layer deposition in the opening in successive atomic layers of barrier material which bonds to the dielectric layer, an intermediate material which bonds to the barrier material layer, and a conductor core material which bonds to the intermediate material. The conductor core bonds to the conductor core material. This method results in an integrated circuit having reduced overall barrier resistivity, increased electromigration resistance, and improved resistance to interface diffusion as compared to the prior art.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
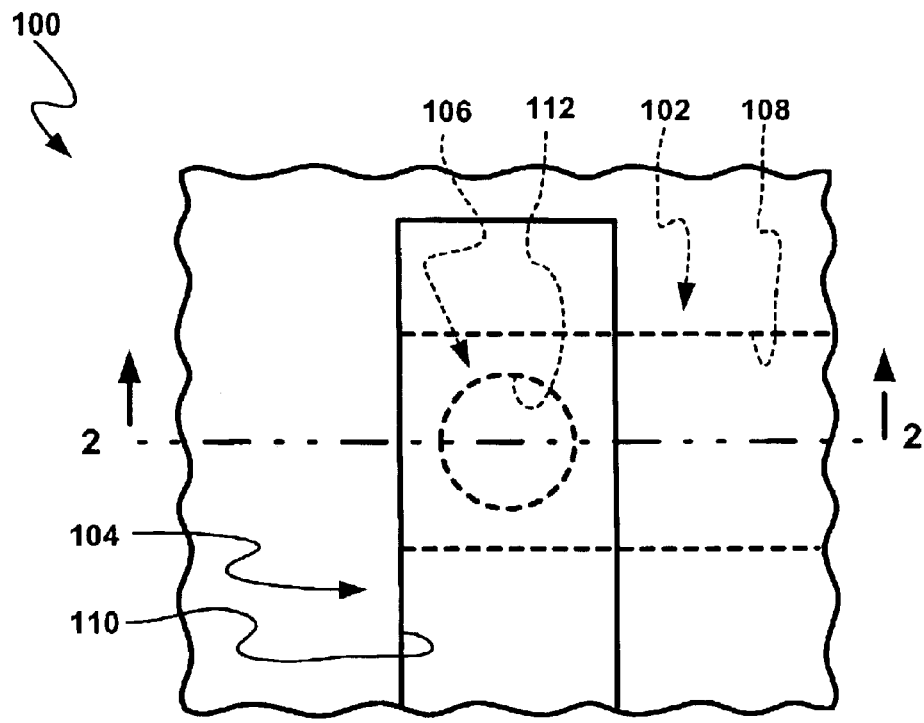
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
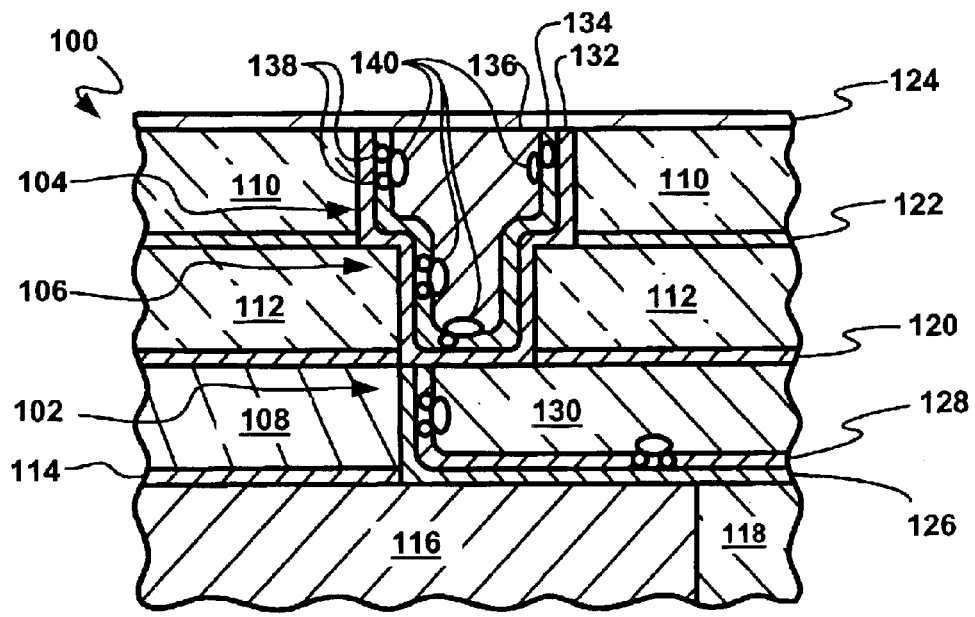
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1 (PRIOR ART).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136.

The barrier layers 126 and 132 are used to prevent diffusion of the conductor materials into the adjacent areas of the semiconductor device. The seed layers 128 and 134 form electrodes on which the conductor materials of the conductor cores 130 and 136 are deposited. The seed layers 128 and 134 are of substantially the same conductor material as the conductor cores 130 and 136 and become part of the respective conductor cores 130 and 136 after the deposition.

Since the seed layers 128 and 134 are used for electrodes during the electroplating of the respective copper conductor cores 130 and 136, the agglomerates 138 prevent proper deposition of the copper so as to cause the formation of voids 140 in the conductor cores 130 and 136. Most problematic is the formation of the voids 140 in the via 106 which reduces the current-carrying cross-section of the via 106 and accelerates electromigration which can enlarge the voids 140 or create new voids which lead to eventual failure of the integrated circuit.

Figure 3:
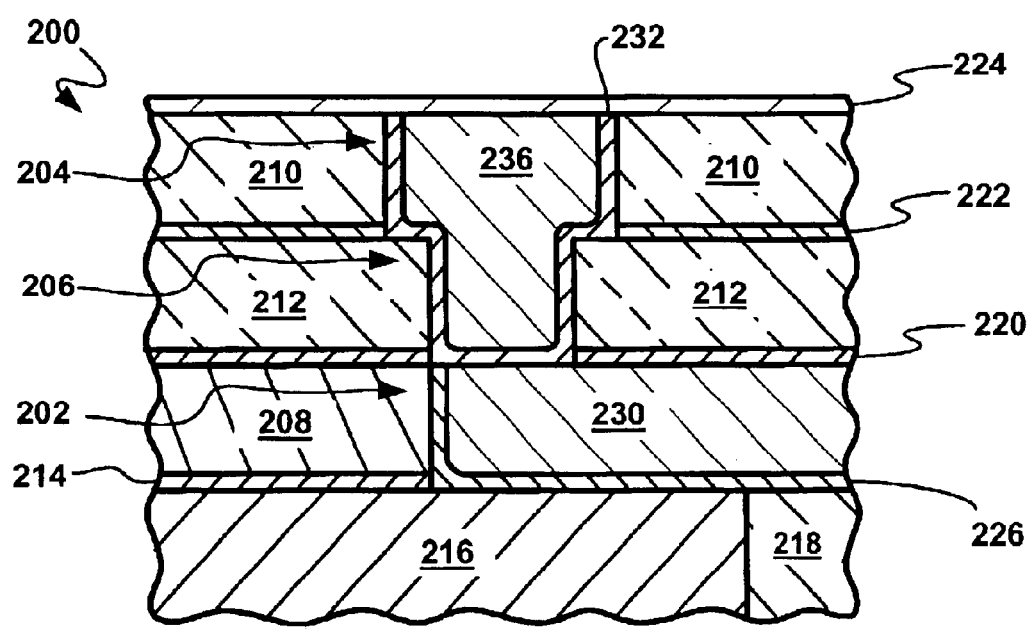
FIG. 3 is a cross-section similar to FIG. 2 (PRIOR ART) showing the barrier layer of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second channel dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown).

This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a seedless barrier layer 226 around a conductor core 230. The second channel 204 and the via 206 include a seedless barrier layer 232 around a conductor core 236. The seedless barrier layers 226 and 232 are used to prevent diffusion of the conductor materials into the adjacent areas of the semiconductor device.

In the present invention, the barrier layer deposition is performed by atomic layer deposition (ALD) to promote barrier layer to dielectric layer adhesion, especially with low dielectric constant (low K) dielectric layers. A thin conformal ALD of an atomic layer of a barrier material is deposited with enhanced adhesion to the dielectric layer due to the covering of and interlocking with the small 15 Å to 30 Å pores in low k dielectric materials. Then, the thin conformal ALD continues with an atomic layer of an intermediate material being deposited with strong adhesion to the barrier material due to intermetallic bonding. Finally, the thin conformal ALD ends with an atomic layer of a conductor core material being deposited with strong adhesion to the intermediate material due to intermetallic bonding.

The seedless barrier layers 226 and 232 form electrodes for conformal nucleation of conductor material of the conductor cores 230 and 236 by electroplating, electroless plating or a combination of electroless plating and electroplating. This process allows the seed layers, which were previously required as electrodes, to be optional.

It has been discovered that, for seedless barrier layers and low k dielectric layers, the initial portion of the ALD can be of a tantalum-based (Ta, TaN, TaC) barrier material, the subsequent portion of the ALD can add intermediate materials such as aluminum (Al), tin (Sn), chromium (Cr), and zinc (Zn), and combinations thereof, and the end portion of the ALD can add the copper conductor core material.

It has also been discovered that, for seedless barrier layers and low k dielectric layers, the initial portion of the ALD can be of a tungsten-based (W, WN, WC) barrier material, the subsequent portion of the ALD can add intermediate materials such as nickel (Ni), palladium (Pd), zirconium, and combinations thereof, and the end portion of the ALD can add the copper conductor core material.

While the above is performed during a single ALD, it would be understood that individual ALD steps could be performed with the initial portion being of barrier material, the subsequent portion being of intermediate material in concentrations ranging from 1 part per million to 10 atomic percent in barrier material, and the end portion being of conductor core material in concentrations ranging from 1 part per million to 50 atomic percent in the barrier and intermediate materials.

The seedless barrier layers 226 and 232 during deposition are thus formed into a seedless mixed layer structure with the conductor core material bonded to the barrier material, which is bonded to the low k dielectric material.

This conformal ALD of mixed barrier material improves the barrier properties of the barrier layer and reduces the overall barrier resistivity and total interconnect resistivity due to reduced cross-sectional dimensions of the high resistivity portion.

Further, various treatments for this skin atomic nucleation/barrier layer using plasma, low temperature, or various different gasses can control the layer properties for direct electrochemical nucleation on the layer for filling the vias and channels by electroplating, electroless plating, or by a combination of electroless plating and electroplating. In addition to conformal nucleation on the barrier layer providing enhanced via and channel profiles, the electroplating process would provide high bottom deposition rates which would be especially valuable for features 100 nm and below.

For example, ammonia plasma treatment of the barrier layer leads to reducing oxygen at the surface and to high density copper nucleation on the barrier layer resulting in a high quality conformal nucleation film. The same effect can be achieved by anneal of the barrier layer in a vacuum.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$), silicon oxynitride (SiON) or low dielectric constant materials such as silicon carbide (SiC) with dielectric constants below 5.5.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

What is claimed is:

1. A method of manufacturing an integrated circuit comprising:

providing a semiconductor substrate having a semiconductor device provided thereon;

forming a first dielectric layer over the semiconductor substrate;

forming an opening in the first dielectric layer, lining the first dielectric layer by atomic layer deposition with a barrier layer of mixed atomic layers of a barrier material, an intermediate material, and a conductor core material; and filling the opening with conductor core material connected to the semiconductor device and bonded to the conductor core material of the barrier layer.

2. The method of manufacturing an integrated circuit as claimed in claim 1 wherein lining the first dielectric layer with a barrier layer uses an intermediate material selected from a group consisting of aluminum, tin, chromium, zinc, nickel, palladium, zirconium, and a combination thereof.

3. The method of manufacturing an integrated circuit as claimed in claim 1 wherein filling the opening with a conductor core uses a material selected from a group consisting of copper, aluminum, gold, silver, a compound thereof, and a combination thereof.

4. A method of manufacturing an integrated circuit comprising:

providing a semiconductor substrate having a semiconductor device provided thereon;

forming a device dielectric layer on the semiconductor substrate;

forming a first channel dielectric layer on the device dielectric layer;

forming a first channel opening in the first channel dielectric layer, the first channel opening open to the semiconductor device;

lining the first dielectric layer by atomic layer deposition with a first barrier layer of mixed atomic layers of a barrier material, an intermediate material, and a conductor core material;

filling the first channel opening with a first conductor core connected to the semiconductor device and bonded to the conductor core material of the first barrier layer;

planarizing the first barrier layer, the first conductor core, and the first dielectric layer;

forming a via dielectric layer over the first barrier layer, the first conductor core, and the first dielectric layer;

forming a second channel dielectric layer over the via dielectric layer, forming a second channel and via openings in the second channel and via dielectric layers, the second channel and via openings open to the first conductor core;

lining the second channel and via dielectric layer by atomic layer deposition with a second barrier layer of mixed atomic layers of a barrier material, an element, and a conductor core material;

filling the second channel and via opening with a second conductor core connected to the first conductor core and bonded to the conductor core material of the second barrier layer; and planarizing the second barrier layer, the second conductor core, and the second dielectric layer.

5. The method of manufacturing an integrated circuit as claimed in claim 4 wherein lining the first and second barrier layers uses materials selected from a group consisting of tantalum, a carbide thereof, a nitride thereof, and a combination thereof, and the element is selected from a group consisting of aluminum, tin, chromium, zinc, and a combination thereof.

6. The method of manufacturing an integrated circuit as claimed in claim 4 wherein lining the first and second barrier layers uses materials selected from a group consisting of tungsten, a carbide thereof, a nitride thereof, and a combination thereof, and the element is selected from a group consisting of nickel, palladium, zirconium, and a combination thereof.

7. The method of manufacturing an integrated circuit as claimed in claim 4 wherein lining the barrier layers uses an element which is between 1 part per million to 10 atomic percent of the barrier layers.

8. The method of manufacturing an integrated circuit as claimed in claim 4 wherein filling the first and second channel and via openings uses conductor cores materials selected from a group consisting of copper, gold, silver, a compound thereof, and a combination thereof.

9. The method of manufacturing an integrated circuit as claimed in claim 4 wherein depositing the barrier layers deposits materials selected from a group consisting of tantalum, titanium, tungsten, a compound thereof, and a combination thereof.

10. The method of manufacturing an integrated circuit as claimed in claim 4 wherein forming the dielectric layers uses a dielectric material having a dielectric constant below 3.9

* * * * *